United States Patent
Nishimura

[11] Patent Number: 5,928,361
[45] Date of Patent: *Jul. 27, 1999

[54] DATA SECURITY DEVICE AND METHOD THEREOF

[75] Inventor: Kiyoshi Nishimura, Kyoto, Japan

[73] Assignee: Rohm Co., Ltd., Kyoto, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/675,219

[22] Filed: Jul. 3, 1996

[30] Foreign Application Priority Data

Jul. 5, 1995 [JP] Japan ................................. 7-169594

[51] Int. Cl.$^6$ ...................................................... G06F 11/00
[52] U.S. Cl. .............................................................. 713/200
[58] Field of Search ................................ 395/186, 188.01, 395/490, 187.01; 380/3, 4, 23, 25; 711/163; 364/479.07; 340/825.3

[56] References Cited

U.S. PATENT DOCUMENTS

| | | | |
|---|---|---|---|
| 4,430,709 | 2/1984 | Scleupen | 395/490 |
| 5,003,409 | 3/1991 | Ishiguro et al. | 360/59 |
| 5,027,317 | 6/1991 | Pepera et al. | 395/490 |
| 5,062,075 | 10/1991 | Yoshida et al. | 395/490 |
| 5,067,077 | 11/1991 | Wakimoto et al. | 395/490 |
| 5,200,646 | 4/1993 | Wand et al. | 307/116 |
| 5,251,304 | 10/1993 | Sibigtroth et al. | 395/490 |
| 5,287,519 | 2/1994 | Dayan et al. | 380/23 |
| 5,377,343 | 12/1994 | Yaezawa | 395/490 |
| 5,379,344 | 1/1995 | Larsson et al. | 380/23 |
| 5,408,633 | 4/1995 | Katsumura et al. | 395/425 |
| 5,430,860 | 7/1995 | Capps, Jr. et al. | 395/490 |
| 5,546,561 | 8/1996 | Kynett et al. | 395/490 |
| 5,557,771 | 9/1996 | Kawaguchi et al. | 395/182.05 |
| 5,559,993 | 9/1996 | Elliot et al. | 395/439 |
| 5,592,641 | 1/1997 | Fandrich et al. | 395/430 |

*Primary Examiner*—Joseph E. Palys
*Attorney, Agent, or Firm*—Baker & Botts, L.L.P.

[57] ABSTRACT

In a data security system, after completion of writing into a P-ROM, a switching circuit is open to thereby disconnect the connection between an internal bus and an external bus. In this state, it is impossible to read the contents out of the P-ROM. To read the contents, a protection releasing terminal is brought to "H". This causes a switching circuit to conduct to make possible read-out. The "H" signal is simultaneously supplied to an erasion signal generating circuit to erase a part selected by an erasion selecting switch. Secrecy is substantially maintained because a program in the P-ROM is not entirely read. The remainder except the erased portion can undergo checking for correctness of writing.

4 Claims, 3 Drawing Sheets

5,928,361

DATA SECURITY DEVICE AND METHOD THEREOF

BACKGROUND OF THE INVENTION

This invention relates to security of data contained in a one-chip microcomputer which is configured to be one-time programmable (OTP) or multi-time programmable (MTP).

The conventional one-chip microcomputer is provided with a P-ROM to store a given program for carrying out an operation. Usually, a user for such one-chip microcomputer provides a self developed program to a vender for one-chip microcomputers. The vender performs writing of this program into a P-ROM of the one-chip microcomputer to deliver it to the user. In this manner, the user acquires a one-chip microcomputer stored with a program as desired.

In the meanwhile, it is readily determined by reading the program out of the P-ROM whether or not the program is properly written into the one-chip microcomputer delivered. However, the vender usually does not disclose an algorithm for reading a program out of a P-ROM to the user. If such algorism is disclosed, programs written for other users are also rendered readable from the same kind of one-chip microcomputers, making it impossible to sustain secrecy on programs for various users.

In this manner, it is impossible for the user to read a program stored in a delivered microcomputer. Therefore, the user usually tries to operate the one-chip microcomputer according to the program, thereby determining whether the program is correctly stored therein or not.

Under such situations, one-chip microcomputers referred to as OTP or MTP are now being used, with which the user can write or read a program.

However, the above-mentioned conventional one-chip microcomputer involves problems stated below.

First, in the case where a program of a one-chip microcomputer is operated to conduct a test on whether a desired function is available or not, it is impossible to determine whether bugs present in the program per se or whether storing is erroneous. There is another problem that executing a program to test the function thereof requires more labor than reading a program to confirm whether it agrees with an original one or not.

Second, a one-chip microcomputer of OTP or MPT is adapted to be written by a user. Accordingly, testing must be conducted on the user side whether writing of a program has been correctly done or not. Therefore, there arises a problem that an algorithm for reading the program has to be disclosed to users, making impossible to keep secrecy on the program written by a user.

SUMMARY OF THE INVENTION

It is therefore an object of the invention to solve the above conventional problems to provide a one-chip microcomputer which is facilitated in testing and improved in secrecy.

According to one aspect of the invention, a data security device comprises: a switching means provided on a bus line between a memory section and a bus line terminal to disconnect the connection between the memory section and the bus line terminal when a protecting signal is supplied thereto and connect the memory section to the bus line terminal when a protection releasing signal is supplied; and an erasing means for erasing the contents stored in the memory section when receiving the protection releasing signal.

Thus, the device is adapted to receive the protection releasing signal to erase the contents stored in the memory section and enable reading it out of the memory section. Therefore, secrecy is kept for the contents stored in the memory section.

Preferably, the erasing means is adapted to erase a predetermined portion of the content stored in the memory section.

The device is adapted to erase only a predetermined portion of the memory section when receiving the protection releasing signal. Therefore, it is possible to read out a part of the contents stored in the memory section, facilitating testing on whether writing is correctly done or not. Also, it is impossible to read out all the contents stored in the memory section, maintaining secrecy on the contents stored. That is, confirmation on the contents of writing is easy to perform while maintaining secrecy on the storing contents.

According to another aspect of the invention, a data security method comprises: receiving a protecting signal to inhibit reading out of a memory section; and receiving a protection releasing signal to erase the contents stored in the memory section and enable reading out of the memory section.

Thus, the method is adapted to receive the protection releasing signal to erase the contents stored in the memory section and enable reading it out of the memory section. Therefore, secrecy is kept for the contents stored in the memory section.

Preferably, erasing is made on a predetermined portion of the memory section when receiving the protection releasing signal.

The method is adapted to erase only a predetermined portion of the memory section when receiving the protection releasing signal. Therefore, it is possible to read out a part of the contents stored in the memory section, facilitating testing on whether writing is correctly done or not. Also, it is impossible to read out all the contents stored in the memory section, maintaining secrecy of the contents stored. That is, confirmation on the contents of writing is easy to perform while maintaining secrecy of the stored contents.

DETAILED DESCRIPTION OF THE PREFERRED EMBODIMENTS

Figure 1:
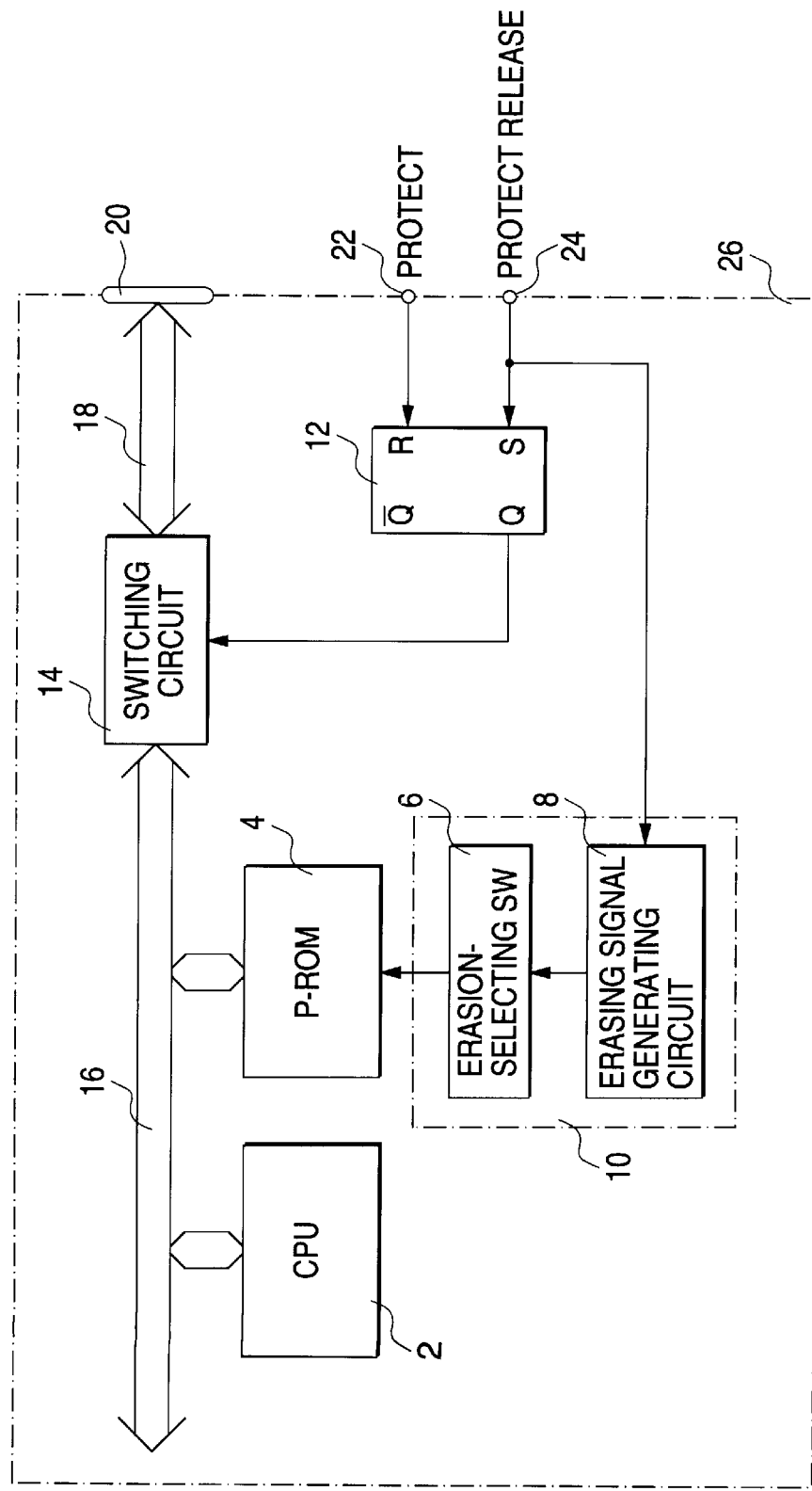
FIG. 1 is a block diagram of a one-chip microcomputer employing a data security device according to one embodiment of the invention.

There is illustrated in FIG. 1 a one-chip microcomputer, to which a data security device 1 according to one embodiment of the invention is applied.

A one-chip microcomputer 26 includes a CPU 2 and a P-ROM 4. The CPU 2 and the P-ROM 4 are connected to each other via an internal bus line 16. The P-ROM 4 is configured by a rewritable memory. The internal bus line 16 is connected to an external bus line 18 through a switching circuit 14 serving as a switching means, whereas the external bus line 18 extends outwards through a bus line terminal 20.

The switching circuit 14 acts to connect/disconnect the internal bus 16 to/from the external bus 18 in dependence on an output Q of a flip-flop 12. An erasing signal generating circuit 8 generates an erasing signal HZRS to supply the same signal to the P-ROM through an erasion-selecting switch 6. In this embodiment, the erasing signal generating circuit 8 and the erasion-selecting switch 6 cooperate to constitute an erasing circuit 10 as an erasing means.

The P-ROM 4 of the one-chip microcomputer 26 is written as follows. First, an "H" signal as a protection releasing signal is supplied to a protection releasing terminal 24. This causes to set the flip-flop 12, thereby bringing the output Q to "H". Receiving the "H" signal, the switching circuit 14 connects the internal bus 16 to the external bus 18. This makes possible to write a program or data to the P-ROM 4 through the bus line terminal 20.

After completion of the writing as above, an "H" signal (a protecting signal) is supplied to the protecting terminal 22 in order to inhibit read-out of the contents of the writing. This causes to reset the flip-flop 12, turning the output Q thereof to "L". Receiving the "L" signal, the switching circuit 14 disconnects the internal bus 16 from the external bus 18. This makes impossible to access the P-ROM 4 through the bus line 20, thus inhibiting read-out of the contents.

Incidentally, confirmation of whether the writing is appropriately done or not is performed through sampling inspection or the like, as follows. First, an "H" signal is supplied to the protection releasing terminal 24 to cause the switching circuit 14 to connect the internal bus 16 to the external bus 18. The "H" signal (a protection releasing signal) at the protection releasing terminal 24 is also supplied to the erasing-signal generating circuit 8. The erasing-signal generating circuit 8 receives this protection releasing signal, and acts to output an erasing signal HZRS over a period of time required for erasing the contents stored in the P-ROM 4. This erasing signal HZRS is supplied via the erasion selecting switch 6 to the P-ROM 4. To this end, erasion is made on a part of the contents selected by the erasing selecting switch 6.

It is possible to check on the quality of the contents written in the P-ROM 4 which is not erased by the above operation. For example, if the capacity of the P-ROM 4 is 16 Mega-bits and the amount of 1 Mega-bits is only allowed to be erased by means of the erasion-selecting switch 6, almost the entire part can be checked.

In the meanwhile, a third person can try to read the contents out of the P-ROM 4 in the similar manner. However, such try would necessarily fail to read out a part of a program, even if the part is small. A program lacking a part thereof is unworthy of utilization in almost all cases, which contributes to keep secrecy substantially on the whole contents written in the P-ROM.

In this manner, checking on writing is possible while maintaining secrecy about the contents of the writing.

Figure 2:
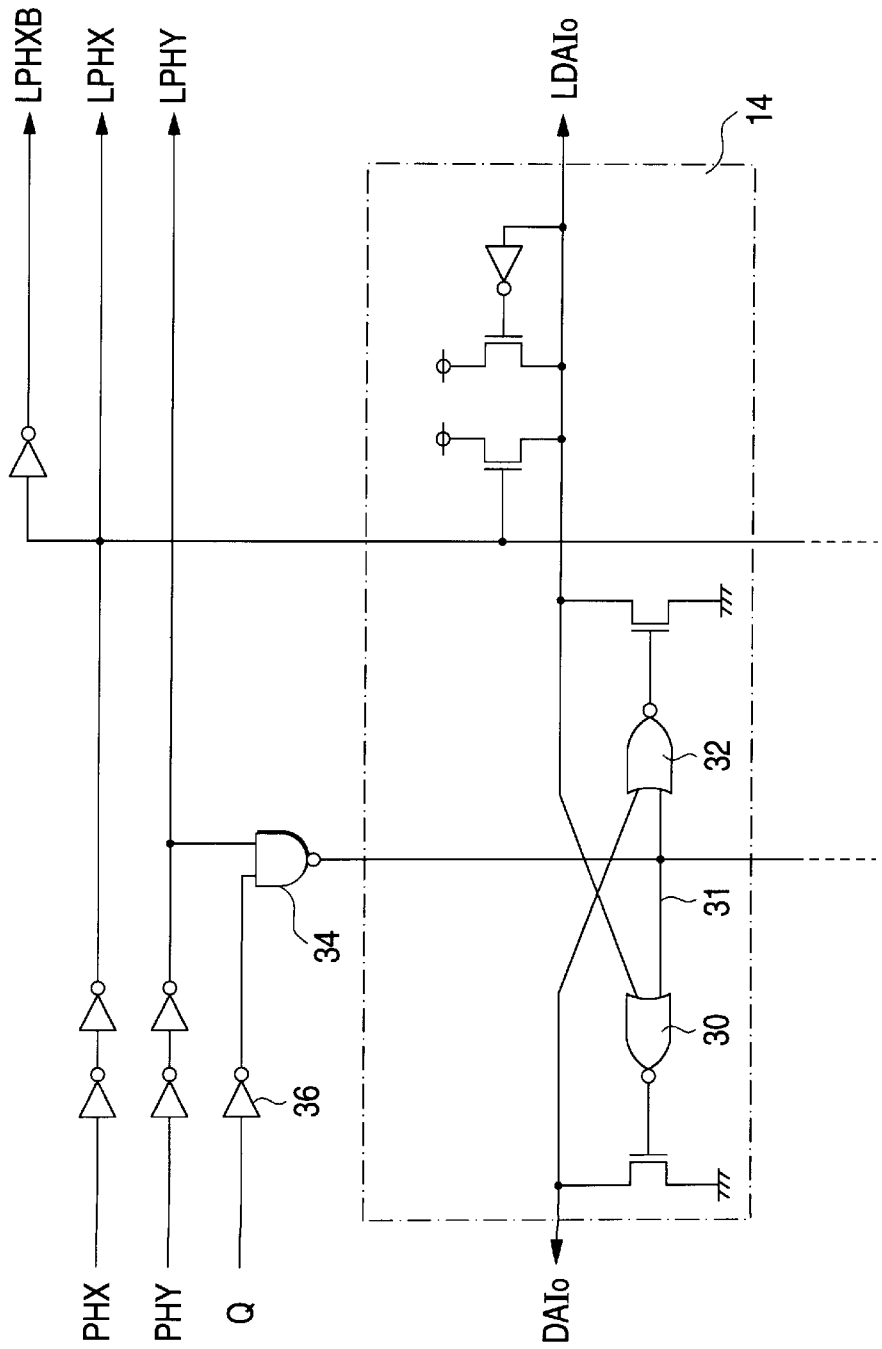
FIG. 2 is a circuit diagram showing one example of a switching circuit.

FIG. 2 shows one example of the switching circuit 14. The output Q of the flip-flop 12 is supplied via a NOT circuit 36 and a NAND circuit 34 to a common input line 31 of the NOR circuits 30, 32. When the output Q of the flip-flop 12 becomes "H", the common input line is brought to "H". This causes the external data bus LDAI0, i.e., a 0 bit of the data bus, to be raised to "H", regardless of data on the internal data bus DAI0, i.e., a 0 bit of the data bus. That is, the data on the internal data bus DAI0 does not appear on the external data bus LDAI0, thus entering in a state of disconnection therebetween.

On the other hand, when the output Q of the flip-flop 12 is "L", the common input line is brought to "L". This causes the data on the internal data bus DAI0 to appear on the external data bus DAI0, entering in a state that they are connected together.

Incidentally, other bits of the data bus DAI1–DAI7, LDAI1–LDAI7 also act to connect the output of the NAND circuits 34, though FIG. 2 shows the internal data bus DAI0 and the external data bus LDAI0. In the figure, PHX, PHY, LPHX, LPHY, and LPHXB are system clocks.

In the embodiment of FIG. 2, although the switching means is provided on the data bus, it may alternatively be provided on an address bus or otherwise on both the data bus and address bus.

Figure 3:
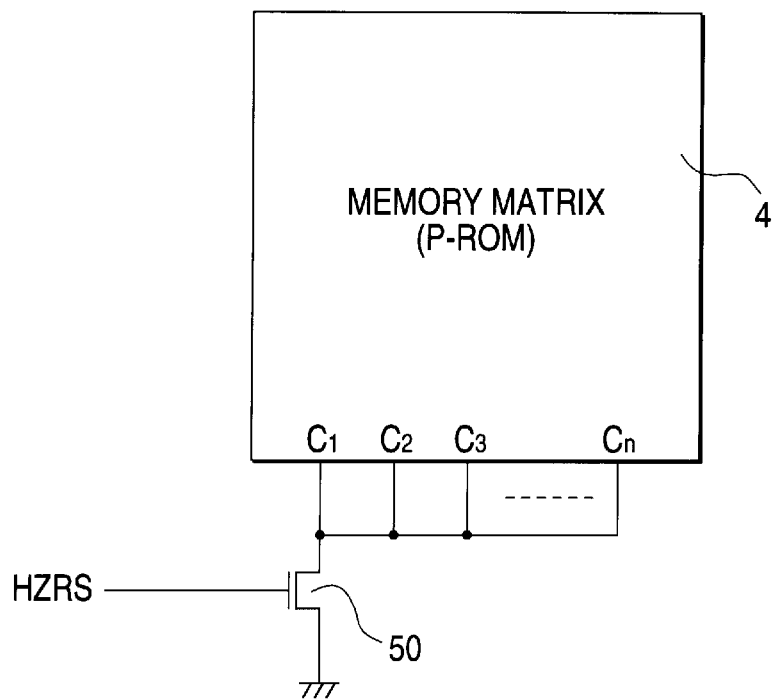
FIG. 3 is a schematic diagram for showing the function of an erasing signal HZRS.

FIG. 3 shows an exemplified manner of applying an erasing signal HZRS to the P-ROM 4. When an erasing signal HZRS in the H level is supplied to a base of a transistor 50, the transistor 50 turns on. This results in grounding of each row of erasing terminals C1, C2 . . . Cn of the P-ROM, thereby erasing the entire contents. In the FIG. 3 example, there is no provision of erasion selecting switch 6 to allow erasion of less than the entire contents. With such arrangement, it is impossible to check on the contents of writing, but secrecy on the contents is secured most complete.

Figure 4:
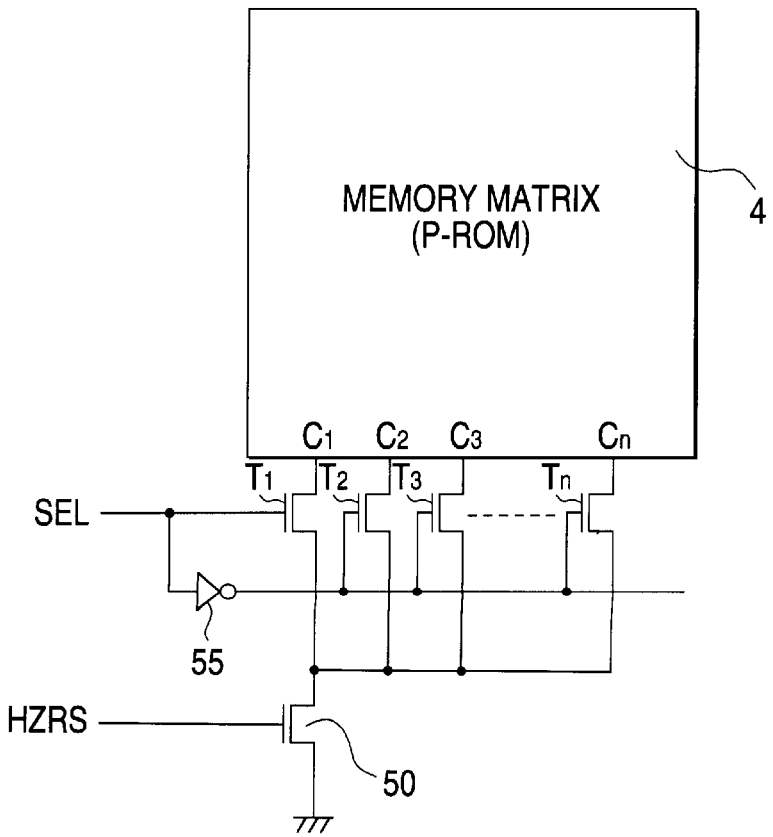
FIG. 4 is a schematic diagram for showing one example of an erasion selecting switch.

An example provided with an erasion selecting switch 6 is shown in FIG. 4. In this example, the erasion selecting switch is constituted by transistors T1, T2 . . . Tn. While an erasing signal HZRS is being supplied, a selecting signal SEL is held to "H". This results in turning on of a transistor Ti being applied with the selecting signal SEL at a gate thereof, while turning off of the transistors T2 . . . Tn applied with the selecting signal SEL at their gates via a inverting gate 55. Consequently, erasion is made on only the contents of the first row corresponding to an erasing terminal C1. A row to be erased can selectively be determined by appropriately setting respective levels of voltages applied to the gates of the transistors T1, T2 . . . Tn.

Incidentally, although the above embodiment is adapted to selectively erase a row, it may alternatively be arranged to select a line or otherwise to erase a specific portion by designating a row and a line.

What is claimed is:

1. A data inspection device with a security arrangement comprising:

a memory section for storing information to be protected from unauthorized readout and having a selected portion;

a switching means provided on a bus line between the memory section and a bus line terminal for disconnecting a connection between the memory section and the bus line terminal to protect all of the information stored in the memory section when a protecting signal is supplied thereto, and for connecting the connection to read out the information stored in the memory section when a protection release signal is supplied thereto; and an erasing means for erasing the selected portion of the information before the information is read out when the protection release signal is supplied to the switching means.

2. The data inspection device as set forth in claim 1 further comprising:

a selection means for determining the selected portion of the information.

3. The data inspection device as set forth in claim 2 wherein the selection means is a circuit constituted by a plurality of transistors.

4. A method for checking data with security for a data inspection device which comprises a memory section for storing information to be protected from unauthorized readout, and a switching means provided on a bus line between the memory section and a bus line terminal, the method comprising the steps of:

determining a selected portion in the information;

disconnecting a connection between the memory section and the bus line terminal to protect all of the information stored in the memory section when a protecting signal is supplied to the switching means;

erasing the selected portion of the information when a protection release signal is supplied to the switching means; and connecting the connection to read out the information stored in the memory section after the erasing of the selected portion of the information.

* * * * *